United States Patent [19]

Kato

[11] Patent Number: 5,459,336
[45] Date of Patent: Oct. 17, 1995

[54] SEMICONDUCTOR PHOTOCOUPLER WITH CHANGING CAPACITANCE

[75] Inventor: Tetsuro Kato, Tokyo, Japan

[73] Assignee: NEC Corporation, Tokyo, Japan

[21] Appl. No.: 286,908

[22] Filed: Aug. 8, 1994

Related U.S. Application Data

[63] Continuation of Ser. No. 31,488, Mar. 15, 1993, abandoned.

[30] Foreign Application Priority Data

Apr. 17, 1992 [JP] Japan ................................. 4-124124

[51] Int. Cl.$^6$ ......................... H01L 27/14; H01L 31/12; H01L 31/16
[52] U.S. Cl. ........................... 257/82; 257/94; 257/101; 257/185; 257/191
[58] Field of Search ........................... 257/80, 81, 82, 257/84, 100, 101, 94, 96, 461, 185, 186, 191, 192, 102, 83, 85, 97

[56] References Cited

U.S. PATENT DOCUMENTS 4,017,880  4/1977  Kasami et al. ......................... 257/101
4,329,625  5/1982  Nishizawa et al. ..................... 257/82 X
4,888,625  12/1989  Mueller ................................... 257/80
5,181,084  1/1993  Bommer et al. ..................... 257/101 X

OTHER PUBLICATIONS

Mabbitt et al, "The Fabrication of and Performance of L.E.D.'s and Detectors from the Ga/In/As Alloy System," Conference: International Electron Devices Meeting (Technical Digest), Washington, D.C., U.S.A. (6–8 Dec. 1976), pp. 829–832.

Marinace, "Junctions with Varying Band–Gap," *IBM Technical Disclosure Bulletin*, vol. 11, No. 4, Sep. 1968, p. 398.

*Primary Examiner*—William Mintel
*Attorney, Agent, or Firm*—Young & Thompson

[57] ABSTRACT

A semiconductor photocoupler is composed of a light emitting element and a light receiving element. Wavelength of emitted light changes as a function of exciting current intensity of the light emitting element, and capacitance of the light receiving element changes as a function of wavelength of receiving light and ceases the capacity change as the receiving light disappears. Signals are transmitted in current-light-capacity type transmission with memory action in the light receiving element.

14 Claims, 2 Drawing Sheets

3: p TYPE $Al_x Ga_{1-x}$ As EPITAXIAL LAYER
4: n TYPE GaAs EPITAXIAL LAYER

1: LIGHT RECEIVING ELEMENT
2: LIGHT EMITTING ELEMENT

3: p TYPE $Al_x Ga_{1-x}$ As EPITAXIAL LAYER
4: n TYPE GaAs EPITAXIAL LAYER

7: n TYPE AlGaAs EPITAXIAL LAYER
8: p TYPE AlGaAs EPITAXIAL LAYER

AlAs RATIO OF CRYSTAL MIXTURE

LED FORWARD CURRENT

SEMICONDUCTOR PHOTOCOUPLER WITH CHANGING CAPACITANCE

This application is a continuation of application Ser. No. 08/031,488, filed Mar. 15, 1993, now abandoned.

BACKGROUND OF THE INVENTION

This invention relates to a semiconductor photocoupler.

A semiconductor photocoupler is used for transmitting information between circuits electrically isolated from each other, and is usually called an optically coupled isolator. Optically coupled isolators on the market are of current-light-current type in information transmission, where an instantaneous magnitude of a current flowing in a phototransistor(or a photodiode) of the secondary circuit is proportional to that driving an LED(light emitting diode) of the primary circuit.

The inventor of the present invention has disclosed another type of optically coupled isolator in his prior invention. The prior invention has been patented as a Japanese Patent No. 1,455,290 entitled "Semiconductor Photocoupler" and published as publication No. 62-60828/'87 on Dec. 18, 1987, listing Tetsuro Kato as inventor and NEC as the assignee.

In the prior invention, two light emitting LEDs and a light receiving LED are disclosed, whereby each of the light emitting LEDs emit light of mutually different wavelengths when driven by separate current sources. The light receiving LED, upon receiving this light, experiences a change in capacitance, the magnitude of which depends on which of the light emitting LEDs is ON and the wavelength of the light emitted therefrom information transmission photocoupler is a current-light-capacitance change, and the capacitance change ceases when the light received at a light receiving element of the secondary circuit disappears. In theory, the prior invention utilizes a deep impurity level in and around the neighborhood of the p-n junction of a light receiving element.

Some impurities located deep in a semiconductor have a very large optical capture cross-section($\sigma_n$ for electron and $\sigma_p$ for hole) for certain wavelengths. Some electrons (or holes) thus captured are seldom released by thermal excitation at room temperature. Therefore, such a trap center (capture cross-section) has an occupation rate of electrons(or holes) of the level dependent only on the wavelengths of the received light. When such a trap center is formed in a p-n junction, the junction capacity is dependent upon the wavelength of the received light, and the junction maintains the capacitance after the received light disappears.

H. Kukimoto et al have disclosed in Physical Review B, vol. 7 No. 6, pp. 2486–2507 Mar. 15, 1973 that oxygen doped in a p-n junction or in a p type Zn, O doped GaP red light LED makes such a trap center.

As for oxygen doped in GaP, the capture cross-section $\sigma_p$ for capturing valence band electron at the oxygen level begins at 1.4 eV of received light energy and increases as the received light energy increases to about $1.7 \times 10^{-16} cm^2$ at 1.8 eV($\lambda \approx 689$ nm), while the capture cross-section $\sigma_n$ for releasing electron trapped at the oxygen level to the conduction band begins at 0.8 eV, increases as received light energy increases, reaches to a maximum of $3.4 \times 10^{-16} cm^2$ at 1.2 eV, and then decreases as received light energy increases. Therefore, this oxygen level will become neutral by received light of energy higher than 1.7 eV because it captures electrons at the oxygen level, and will become positively charged by receiving light at an energy level of about 1.2 eV.

Since the oxygen level is sufficiently deep (0.9 eV from the conduction band), the trapped electrons are thermally released only in a small quantity. Therefore, the GaP red LED doped by Zn, O makes a light receiving element of a semiconductor photocoupler working on current-light-capacitance in information transmission and having a memory action.

In the prior invention, a semiconductor photocoupler is composed of a light receiving element of a GaP red LED doped by Zn, O, and two light emitting elements, one light emitting element being a GaP red LED (1.77 eV), and the other light emitting element being a Si doped GaAs LED (1.29 eV).

The semiconductor photocoupler of the prior invention transmits a binary signal indicating which light emitting element of the two light emitting elements is energized as a binary capacitance change in the light receiving element and maintains the capacitance corresponding to the lastly received wavelength. This photocoupler can be used as a coupler of binary signals, but can not be used as a coupler of analog signals.

As there is one-to-one correspondence between the current in the light emitting element and that in the light receiving element in a conventional optically coupled isolator, the isolator can be used as a coupler of analog signals. If the current-light-capacitance type photocoupler is to be used as a coupler of analog signals, there must be one-to-one correspondence between the current in the light emitting element and the capacitance of the light receiving element.

SUMMARY OF THE INVENTION

Therefore, a primary object of the present invention is to obtain a semiconductor photocoupler of current-light-capacitance type transmission having a one-to-one correspondence between the primary current and the secondary capacitance.

In order to achieve this object, a semiconductor photocoupler of this invention comprises a light emitting element and a light receiving element optically coupled to the light emitting element, and the wavelength of the emitted light changes as a function of the current flowing in the light emitting element, while the capacitance of the light receiving element changes as a function of the wavelength of the received light. The capacitance change of the light receiving element ceases when the receive light disappears.

BRIEF DESCRIPTION OF THE DRAWINGS

Further objects, features, and advantages of this invention will become apparent from a consideration of the following description, the appended claims, and the accompanying drawings in which the same numerals indicate the same or the corresponding parts.

DETAILED DESCRIPTION OF THE PREFERRED EMBODIMENTS

Figure 1A:
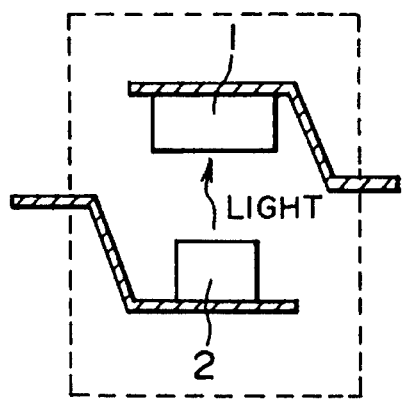
FIGS. 1a–1d show an embodiment of this invention.

Referring to FIG. 1a, a light receiving element 1 and a light emitting element 2 are placed facing to each other. Both the light receiving element 1 and the light emitting element 2 have pairs of electrodes, but in FIG. 1a, only one electrode is shown for each element.

As for the light receiving element 1 of FIG. 1a, a GaP red

LED (pellet size of 0.5 mm□) doped by $2\times10^{17} cm^{-3}$ Zn and $5\times10^{16} cm^{-3}$ O in a p type epitaxial layer is used, and as the light emitting element 2, an AlGaAs LED (pellet size of 0.4 mm□) having a graded ratio of crystal mixture is used. The light receiving element 1 and the light emitting element 2 are placed facing to each other as shown in FIG. 1a, sealed by a primary sealing of transparent resin, and then sealed by black resin covering the whole surface including the primary sealing to the surfaces shown by dotted lines in FIG. 1a as a secondary sealing.

Figure 1D:
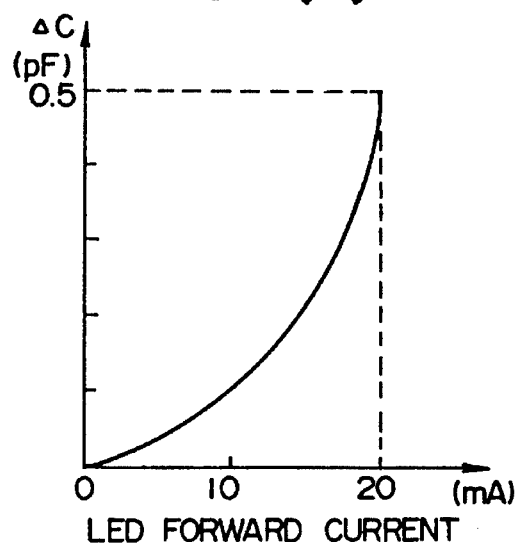
Figure 1B:
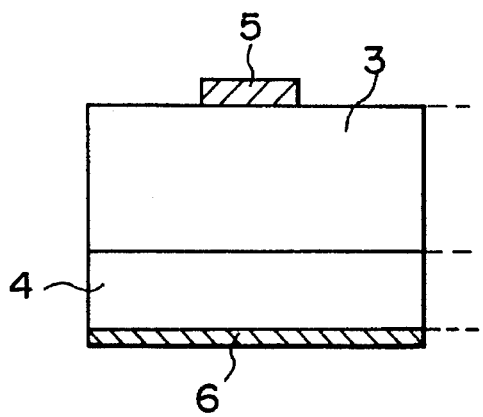

FIG. 1b shows a cross-sectional view of the AlGaAs LED. This light emitting element 2 is fabricated by a process as described below.

Figure 1C:
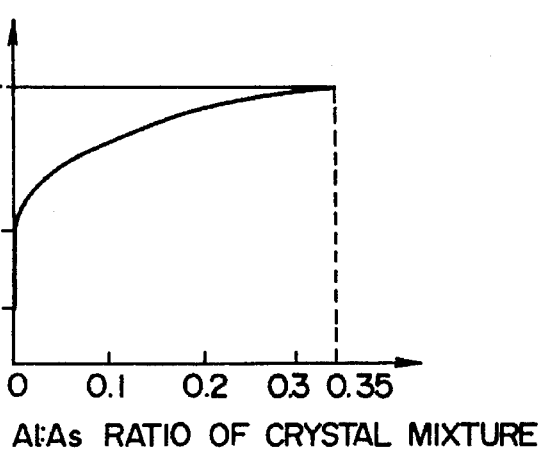

In a first process, Si doped p type $Al_xGa_{1-x}As$ epitaxial layer 3 is grown on an n channel (100) GaAs substrate by a conventional gradually cooled liquid phase epitaxy process. Then Te doped n type GaAs epitaxial layer 4 is generated. The distribution of the ratio of crystal mixture of AlAs in the $Al_xGa_{1-x}As$ epitaxial layer 3 is, as shown in FIG. 1c, x=0.35 at the start of the growth (at the boundary between the GaAs substrate) and x=0 at the boundary with the GaAs layer 4.

Then, the n type GaAs substrate for the epitaxial wafer is eliminated, and a p side electrode 5 and an n side electrode 6 are formed.

The AlGaAs LED thus fabricated emits an infra red light ($\lambda\approx930$ nm) as a Si doped GaAs LED when excited by a low intensity current in forward direction. But as the current intensity is increased, the injected electrons begin to contribute to the light emission at a deep point of the p type $Al_xGa_{1-x}As$ epitaxial layer 3, resulting in a gradual increase of light emission at shorter wavelengths. When the current intensity is further increased, a component of a red light ($\lambda=750\sim690$ nm) is increased.

For a combination of the light emitting element 2 shown in FIG. 1b with a light receiving element 1, the relation between the forward current of the light emitting element 2 and the capacitance change of the light receiving element 1 is shown in FIG. 1d. The capacitance change is measured at a frequency of 100 kHz by a measuring equipment adapted to measure a fine capacitance change by using a capacitance bridge. The initial capacitance when the driving current in the light emitting equipment is zero, is 120 pF. As shown in FIG. 1d, the capacitance increment $\Delta C$ increases monotonously as the current in the light emitting element is increased, maintaining a one-to-one correspondence between the current in the primary circuit and the capacitance in the secondary circuit.

The characteristic shown in FIG. 1d is thought to come from the following cause. That is, in a small current intensity range, components of infra red light of $\lambda$ of about 930 nm predominate and the oxygen level of the light receiving element 1 releases electrons at a larger rate to the conduction band than that of capturing electrons from the valence band at those wavelengths of the received light. As a result, only a small portion of the oxygen level is neutralized to make a very small capacitance change. On the contrary, in a large current intensity range, components of red light of 750~690 nm wavelength range increase, resulting in a comparatively large amount of neutralization of the oxygen level to make a large capacitance change.

As explained, in a photocoupler of this invention, it is apparent that the capacitance change in the light receiving element 1 corresponds to the driving current in the light emitting element 2.

And as is easily understood, the capacitance of the light receiving element 1 is maintained after the received light disappears. When a new light is received, the capacitance of the light receiving element takes a value corresponding to the current intensity of the light emitting element 2 which emits the new light.

Figure 2A:
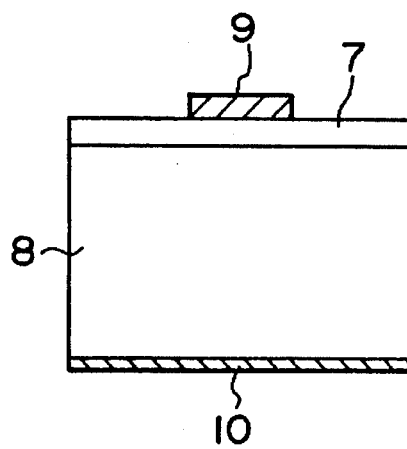
FIGS. 2a–2c show another embodiment of this invention.
Figure 2B:
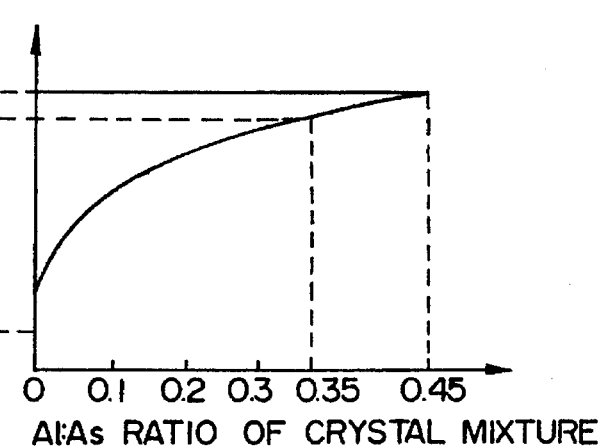
Figure 2C:
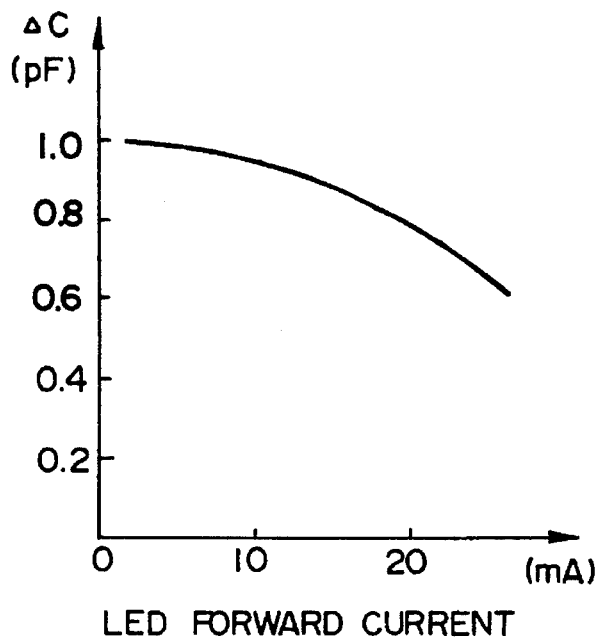

Another embodiment of this invention is illustrated in FIGS. 2a~2c. FIG. 2a is a crosssectional view of a light emitting element used in this embodiment. The light receiving element used in this embodiment and the spacing of the light receiving element 1 and the light emitting element are the same as described in connection with FIG. 1a.

On an n type GaAs substrate, a Si doped layer $Al_yGa_{1-y}As$ is epitaxially and continually grown to form an n type AlGaAs epitaxial layer 7 with a decreasing ratio of crystal mixture (maximum 0.45 and minimum 0) and a p type AlGaAs epitaxial layer 8. Then, the GaAs substrate is eliminated and an n side electrode 9 and a p side electrode 10 are formed.

FIG. 2b shows a distribution of the ratio of the crystal mixture of the epitaxial layers 7 and 8. In this embodiment shown by FIGS. 2, contrary to the embodiment shown in FIGS. 1, components of shorter wavelengths predominate in a small current intensity range, and components of longer wavelengths increase in a large current intensity range. Thus, as shown in FIG. 2c, the amount of the capacitance change $\Delta C$ decreases with the increasing current intensity of the light emitting element. Still one-to-one correspondence between the current in the primary circuit and the capacitance change in the secondary circuit is maintained.

Heretofore, only preferred embodiments of this invention have been described, but it must be understood that this invention is not limited by the embodiments described. Any type of light emitting element 2 where the wavelength of the emitted light changes as a function of the driving current of the element, and any type of light receiving element where the capacitance of the element changes as a function of the wavelength of the received light can be used in this invention.

What is claimed:

1. A photocapacitance semiconductor photocoupler comprising:

a single light emitting element for emitting light when excited by driving current, and a light receiving element for receiving the light emitted by said single light emitting element;

wherein a wavelength of the light emitted by said single light emitting element changes as a function of intensity of said driving current, a capacitance measured across said light receiving element changes as a function of the wavelength of the received light, said capacitance ceases to change when said received light disappears, and is maintained until a new light is emitted from said single light emitting element and received by said light receiving element, said capacitance measured across said light receiving element changing to a new value corresponding to a new wavelength of said new light.

2. A semiconductor photocoupler according to claim 1, wherein said light receiving element comprises a GaP pn junction doped by Zn and 0 in a p type epitaxial layer.

3. A semiconductor photocoupler according to claim 1, wherein said light emitting element comprises a p type $Al_xGa_{1-x}As$ epitaxial layer having a graded ratio of crystal mixture, and an n type GaAs epitaxial layer formed on said p type $Al_xGa_{1-x}As$ epitaxial layer, said ratio of crystal mixture decreasing for Al as said p type layer approaches a boundary with said n type layer.

4. A semiconductor photocoupler according to claim 3, wherein said light receiving element comprises a GaP pn junction doped by Zn and O in a p type epitaxial layer.

5. A semiconductor photocoupler according to claim 1, wherein said light emitting element comprises an n type AlGaAs epitaxial layer and a p type AlGaAs epitaxial layer formed on said n type layer, said n type layer and said p type layer having a continuously graded ratio of crystal mixture in which said ratio of crystal mixture decreases for Al from said n type layer to said p type layer.

6. A semiconductor photocoupler according to claim 5, wherein said light receiving element comprises a GaP pn junction doped by Zn and O in a p type epitaxial layer.

7. A semiconductor photocoupler according to claim 1, wherein said light emitting element comprises a p type $Al_xGa_{1-x}As$ epitaxial layer having a graded ratio of crystal mixture, and an n type epitaxial layer formed on said p type $Al_xGa_{1-x}As$ epitaxial layer.

8. A semiconductor photocoupler according to claim 1, wherein said light emitting element comprises a p type epitaxial layer, and an n type $Al_xGa_{1-x}As$ epitaxial layer having a graded ratio of crystal mixture formed on said p type epitaxial layer.

9. A semiconductor photocoupler according to claim 1, wherein said light emitting element comprises a p type epitaxial layer, and an n type epitaxial layer having a graded ratio of crystal mixture formed on said p type epitaxial layer.

10. A semiconductor photocoupler according to claim 1, wherein said light emitting element comprises a p type epitaxial layer having a graded ratio of crystal mixture, and an n type epitaxial layer formed on said p type epitaxial layer.

11. A semiconductor photocoupler comprising:

a single light emitting element driven by a driving current which has a changeable current value and emitting light which has an infrared light component and a red light component, a ratio of said infrared light component to said red light component being changed in accordance with a change in current value of said driving current; and a light receiving element receiving the light emitted by said light emitting element, said light receiving element having a capacitance which is changed in accordance with said ratio of said infrared light component to said red light component so that the change in current value of said driving current for driving said light emitting element is represented by the change in capacitance of said light receiving element.

12. The device as claimed in claim 11, wherein said ratio of said infrared light component to said red light component increases when said driving current has a decreasing current value and decreases when said driving current has an increasing current value.

13. The device as claimed in claim 12, wherein said light emitting element includes a p-type semiconductor layer having first and second surfaces, an n-type semiconductor layer having third and fourth surfaces, said first surface of said p-type semiconductor layer being in contact with said third surface of said n-type semiconductor layer to form a pn junction therebetween, a first electrode formed on said second surface of said p-type semiconductor layer, and a second electrode formed on said fourth surface of said n-type semiconductor layer, said p-type semiconductor layer being an AlGaAs layer in which a concentration of Al at said second surface is larger than a concentration of Al at said first surface.

14. The device as claimed in claim 12, wherein said light emitting element includes a p-type semiconductor layer having first and second surfaces, an n-type semiconductor layer having third and fourth surfaces, said first surface of said p-type semiconductor layer being in contact with said third surface of said n-type semiconductor layer to form a pn junction therebetween, a first electrode formed on said second surface of said p-type semiconductor layer, and a second electrode formed on said fourth surface of said n-type semiconductor layer, said p-type semiconductor layer being an AlGaAs layer in which a concentration of Al at said second surface is smaller than a concentration of Al at said first surface.

\* \* \* \* \*